United States Patent [19]
Angelopoulos et al.

[11] Patent Number: 5,935,652
[45] Date of Patent: Aug. 10, 1999

[54] METHOD FOR REDUCING SEED DEPOSITION IN ELECTROLESS PLATING

[75] Inventors: Anastasios Peter Angelopoulos; Gerald Walter Jones, both of Apalachin; Luis Jesus Matienzo, Endicott; Thomas Richard Miller; Voya Rista Markovich, both of Endwell, all of N.Y.

[73] Assignee: International Business Machines Corp., Armonk, N.Y.

[21] Appl. No.: 09/046,245

[22] Filed: Mar. 23, 1998

[51] Int. Cl.[6] .................................................. B05D 3/02
[52] U.S. Cl. .................. 427/316; 427/314; 427/336; 427/337; 427/385.5; 427/98; 427/304; 427/443.1
[58] Field of Search .................... 427/314, 316, 427/336, 337, 340, 385.5, 386, 98, 304, 443.1

[56] References Cited

U.S. PATENT DOCUMENTS

| | | |
|---|---|---|
| 4,075,260 | 2/1978 | Tsen et al. .................. 260/830 TW |
| 4,303,715 | 12/1981 | Chang . |
| 4,640,718 | 2/1987 | Alnot et al. . |
| 4,795,660 | 1/1989 | Cooray et al. . |
| 4,808,431 | 2/1989 | Rickert . |
| 4,969,979 | 11/1990 | Appelt et al. .............................. 204/15 |
| 5,178,914 | 1/1993 | Goldblatt et al. ....................... 427/306 |
| 5,183,692 | 2/1993 | Mukerji et al. . |
| 5,374,344 | 12/1994 | Gall et al. . |
| 5,443,865 | 8/1995 | Tisdale et al. . |

Primary Examiner—Brian K. Talbot
Attorney, Agent, or Firm—William N. Hogg

[57] ABSTRACT

The present invention provides a novel method of reducing the amount of seed deposited on polymeric dielectric surfaces. The method comprises the following steps: providing a work-piece coated with a polymeric dielectric layer; baking the work-piece to modify the surface of the polymeric dielectric layer; then applying the seed to polymeric dielectric layer and electrolessly plating metal to the seed layer. The invention also relates to a circuit board produced by the method of the present invention.

22 Claims, 2 Drawing Sheets

METHOD FOR REDUCING SEED
DEPOSITION IN ELECTROLESS PLATING

BACKGROUND OF THE INVENTION

In fabricating circuitized structures, such as printed circuit boards, electroless plating is often employed to plate metal, such as copper, to form circuitization onto dielectric surfaces. In forming such circuitization, the surface of a photoimaged dielectric which is present on substrate, which has through holes photoimaged in the dielectric, is blanket coated with seed. Next, a photoresist is blanket coated onto the seed layer and photoimaged in a pattern corresponding to the designed cicuitization pattern. The line channels are developed away, and the work-piece is immersed in a electroless plating bath so that copper is additively plated in the channels atop the exposed seed; copper is also plated into the through holes in the photoimageable dielectric at same time. The photoresist is then stripped, leaving circuitization atop the dielectric. The seed which does not have copper deposited thereon, is then removed. If desired, the copper is then further plated.

However, conventional electroless plating methods often suffer from excessive seed deposition; the presence of excessive seed on a circuit board leads to leakage shorts, poor adhesion of the photoresist onto seed due to uneven surface. Excess seed can also lead to unwanted metal plating in subsequent steps.

It would be desirable to have a method for depositing seed which does not result in excessive seed deposition.

SUMMARY OF THE INVENTION

The present invention provides a novel method of reducing the amount of seed deposited on polymeric dielectric surfaces. The method comprises the following steps: providing a work-piece coated with a polymeric dielectric layer; baking the work-piece for a time and temperature sufficient to modify the surface of the polymeric dielectric layer,; then applying the seed to polymeric dielectric layer and electrolessly plating metal to the seed layer. The invention also relates to a circuit board produced by the method of the present invention.

DETAILED DESCRIPTION OF THE INVENTION

Figure 1:
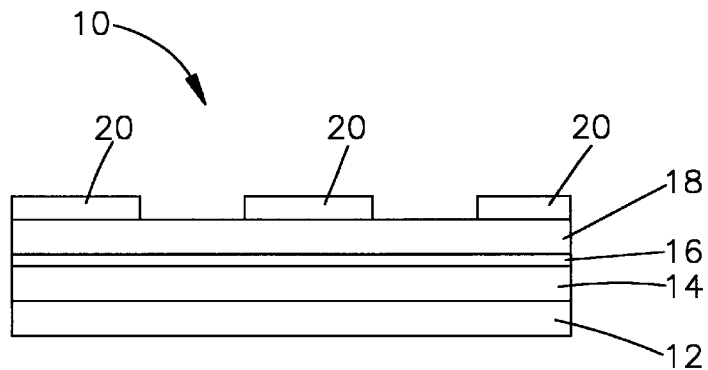
FIG. 1 is a circuit board having modified, baked polymeric dielectric layer, polymeric surfactant and seed deposited thereon.

The present invention provides a novel method of reducing the amount of seed deposited on polymeric dielectric surfaces. The method comprises the following steps: providing a work-piece comprising a substrate coated with a polymeric dielectric layer. Preferably, the polymeric dielectric surface is roughened, such as for example, by using a swelling agent, a hole cleaning operation, an oxidizing agent, a plasma treatment, a vapor blast, mechanical abrasive operation, or chemically roughening with etchants such as chrome sulfuric acid or permanganate. The work piece with the polymeric dielectric layer is then baked. Preferably the polymeric dielectric is exposed to the surrounding ambient atmosphere; that is nothing is disposed atop the polymeric dielectric during the bake step. The workpiece is baked for a time and temperature sufficient to modify the surface of the polymeric dielectric. The bake temperature for the preferred polymeric dielectric is preferably greater 25° C., more preferably at least 100° C., even more preferably at least 120° C. For the preferred polymeric dielectric the preferred temperature is preferably from about 100° to 210° C.; more preferably from about 110° to 190° C., most preferably about 180° C.

Bake temperatures should not exceed the temperature at which the polymeric dielectric layer begins to degrade; for example, for the preferred polymeric dielectric, the bake temperature preferably does not exceed about 210° C. Temperatures above about 210° C. for about one hour lead to cracking detectable under scanning electron microscopy and thus such temperatures are less preferred. For the preferred polymeric dielectric good results have been obtained by baking the polymeric dielectric at 180° C. for about 2 hours. The bake can be under low oxygen such as under a 100% nitrogen atmosphere or in an oxygen atmosphere or in air. The bake step is performed in conventional ovens such as for example vacuum ovens, static or convection ovens with or without gas purge such as oxygen or nitrogen.

Preferably the work piece is next treated with a polymeric surfactant which is capable of hydrogen bonding to weak acidic groups on the surface of the polymeric dielectric. Preferably, the polymeric surfactant is a cationic polyelectrolyte, more preferably a polyelectrolyte having amide groups, such as for example cationic polyacrylamide or cationic polyamidoamine. The polymeric surfactant has a molecular weight of from about $10^5$ to $10^7$, preferably about $10^6$. A suitable cationic polyacrylamide polyelectrolyte is available under trade name "Polytec" from Polytec Inc.; a suitable cationic polyamido amine polyelectrolyte is available under trade name "Cartaretin" from Sandoz Chemical Co. After the baked dielectric surface is treated with the polymeric surfactant, the seed is then applied as a blanket layer to the surface of the polymeric dielectric by conventional techniques, such as by depositing the work piece in a conventional colloidal seed bath such as for example, a Pd/Sn bath. Suitable seed is negatively charged metal in colloidal form such as for example, colloidal gold, palladium, or nickel.

Conventional resist, preferably photoresist, is then applied over the seed layer and patterned, preferably photoimaged, using conventional techniques. The photoresist is photopatterned to remove the resist in areas where circuitization lines are desired. Then metal is electrolessly plated to the seeded areas which are not covered with the photoresist, using conventional techniques such as by depositing the workpiece in a conventional electroless plating bath. Thereafter, the workpiece is typically electrolyticaly plated, employing conventional techniques. The photoresist is then typically stripped, using conventional stripping agents. Thereafter the seed is also stripped if desired. An advantage of the present method is that, since less seed is deposited, the seed is easily stripped.

Thus for a particular polymeric dielectric, to determine a suitable temperature at which to bake such polymeric dielectric so as to obtain minimum uniform seed deposition upon subsequent seeding, several test samples of polymeric dielectric are baked at different temperatures at either a set time or various times. The samples are then seeded and the deposited seed quantified.

The Polymeric Dielectric Layer

Preferably the polymeric dielectric layer contains at least trace sulfur atoms or sulfur moieties. In the preferred embodiment, sulfur moieties are provided on the surface of the dielectric by a cationic photoinitiator present in the polymeric dielectric. Even if substantially all of the photoinitiator is consumed during a photoimaging step, some sulfur moieties remain in the photoimaged polymeric dielectric.

Preferably, the polymeric dielectric is an organic polymeric dielectric having hydroxyl groups, more preferably the polymeric dielectric layer comprises epoxy resin. Preferably the polymeric dielectric layer is a photoresist. Preferably the polymeric dielectric has sulfur moiety capable of binding to hydroxyl groups on the surface of the polymeric dielectric layer during baking. Preferably the polymeric dielectric layer contains a cationic photoinitiator having sulfur moiety such as a complex triarylsulfonium hexafluoroantimonate salt. A suitable complex triarylsulfonium hexafluoroantimonate salt cationic photoinitiator is commercially available as UVE 1014 from General Electric Company, is now available as UVI 6974 from Union Carbide Company.

The preferred polymeric dielectric has solids which are preferably comprised of: from about 10 to 80%, preferably from 20 to 40%, more preferably about 30%, of phenoxy polyol resin which is the condensation product of epichlorohydrin and bisphenol A, having a molecular weight of from about 40,000 to 130,000, preferably about 60,000 to 90,000, more preferably greater than 60,000; from about 20 to 90%, preferably from about 25 to 30%, most preferably about 25%, of an epoxidized multifunctional bisphenol A formaldehyde novolac resin having a molecular weight of from about 4,000 to 10,000, preferably about 5,000 to 7,000; from 0 to 50%, preferably from about 35 to 50%, more preferably 40 to 45%, most preferably about 45%, of a halogenated, preferably brominated, diglycidyl ether of bisphenol A having a molecular weight of from about 600 to 2,500, preferably about 1,000 to 1,700; and from about 0.1 to 15 parts, preferably about 5 parts, by weight of the total resin weight, a cationic photoinitiator. The solvent component of the dielectric film preferably is comprised of propyleneglycol monomethyl ether acetate and 0 to less than about 10% propylene carbonate. The propylene carbonate is preferably the carrier for the preferred photoinitiator.

Preferably the phenoxy polyol resin has an epoxide value of from about 0.001 to about 3, more preferably from about 0.01 to about 0.3, most preferably about 0.03 equivalents per kg, a weight per epoxide of from about 10,000 to about 60,000, more preferably from about 20,000 to about 50,000, most preferably about 37,000 and a glass transition temperature of from about 80 to about 150 more preferably from about 90 to about 110, most preferably about 98° C.

Preferably, the multifunctional epoxy bisphenol A formaldehyde novolac resin has an epoxide value of from about 1 to about 10 more preferably from about 3 to about 6, most preferably about 4.7 equivalents per kilogram, a weight per epoxide of from about 180 to about 300, more preferably from about 190 to about 230, most preferably about 215 and a melting point of from about 60° C. to about 150° C., more preferably from about 70° C. to about 90° C., most preferably about 82° C.

Preferably, the diglycidyl ether of the halogenated bisphenol A, has an epoxide value of from about 0.1 to about 5, more preferably from about 1 to about 3, most preferably about 1.5 equivalents per kilogram, a weight per epoxide of from about 200 to about 1000, more preferably from about 500 to about 750, most preferably about 675 and a melting point of from about 70 to about 150, more preferably from about 80 to about 110, most preferably about 97° C.

A suitable phenoxy polyol resin is available under the trade name "PKHC", formerly available from Union Carbide Corporation, now available from Phenoxy Resin Associates. A suitable octafunctional bisphenol A formerly available under the trade name Epirez SU-8 from High Tek Polymers, is now available as "Epon SU8" from Shell Chemical Company. A suitable tetrabromobisphenol A formerly available under the trade name "Epirez 5183" from High Tek Polymers, is now available as "Epon 1183" from Shell Chemical Company.

It has been discovered that the baking of the polymeric dielectric surface modifies the surface of the dielectric so that when the dielectric surface is subsequently contacted with the polymeric surfactant less polymeric surfactant adheres to the baked dielectric surface as compared to an unbaked dielectric surface. Since the seed adheres to the polymeric surfactant deposited on the dielectric surface, by reducing the amount of polymeric surfactant on the dielectric surface, the amount of seed is also reduced. More specifically, it has been discovered that the amide groups in the polymeric surfactant bind to hydroxyl groups present on the surface of the polymeric dielectric. By baking the polymeric dielectric, it is believed that scavenging groups, such as sulfur containing moieties, present on the surface of the polymeric dielectric bind to the oxygen of the hydroxyl groups upon baking, so that such groups are not available for binding to the polymeric surfactant. Typically, the bake step oxidizes sulfur moieties so that greater than 27% oxidized sulfur moieties are present.

The step of baking the polymeric dielectric before applying the seed, modifies the polymeric dielectric surface; this modification reduces the wetting force of the polymeric dielectric surface in sodium hydroxide. The most preferred degree of modification, that is the modification which permits minimal seed deposition, occurs when the surface of the baked polymeric dielectric displays wetting force in sodium hydroxide which is from about 35% greater to about 10% less than the wetting force of such surface in water at pH 5.2. Described another way, the modification which permits minimal seed deposition occurs when the wetting force in 1 N NaOH is within about 25% of the mean of the wetting force value in water at pH 5.2 and the wetting force in 1 N NaOH.

If the polymeric dielectric layer is not subjected to a bake step, the surface of the polymeric dielectric, when immersed in 1 N NaOH, pH 14, is substantially wettable, yet in water at pH 5.2, such polymeric dielectric surface is hydrophobic. In contrast, If the polymeric dielectric is subjected to a bake step, the baked polymeric dielectric surface is hydrophobic in both water and in 1 N NaOH.

Alternatively, after the bake step, the wettability of the surface of the dielectric samples is examined in 1 N NaOH and in water. The bake temperature which produces a sample having a surface which displays the same wettability in the water and the NaOH, will provide minimum seed deposition yet still provides uniform seed coverage. Minimal seed deposition is preferably not greater than about 11 $\mu g/cm^2$ seed, more preferably not more than about 9 $\mu g/cm^2$, as measured by electron microprobe analysis also referred to as "EMPA". Seed deposited in about 5 to 7 $\mu g/cm^2$ will typically provide a monolayer of seed on the dielectric and is thus most desired. While less than about 4 $\mu g/cm^2$ of seed may result in areas where seed not deposited and thus is less desired.

As a result of the reduced seed deposition the electrolessly and/or electrolytically plated metal features such as circuit lines display good line resolution.

As shown in FIG. 1, the workpiece, a circuitized structure 10 produced by the method of the invention, is comprised of substrate 12, baked polymeric dielectric layer 14 disposed on substrate 12, polymeric surfactant 16 disposed on baked polymeric dielectric layer 14, seed 18 disposed on at least a portion of polymeric surfactant 16, metal 20, preferably copper, disposed on and adhering to at least a portion of seed layer 18.

EXAMPLE 1

A photo-imageable dielectric was coated onto glass/epoxy laminates containing a tetrabromo bisphenol A epoxy resin available as 8213 resin from Ciba Geigy Inc. The polymeric dielectric has solids which comprise: about 30%, of "PKHC", from Union Carbide Corporation or from Phenoxy Resin Associates, a phenoxy polyol resin; about 25% of Epirez SU-8 from High Tek Polymers or "Epon SU8" from Shell Chemical Company, an epoxidized multifunctional bisphenol A formaldehyde novolac resin; "Epirez 5183" from High Tek Polymers, or "Epon 1183" from Shell Chemical Company, about 45% of a diglycidyl ether of tetrabromobisphenol A; and about 5 parts, by weight of the total resin weight, of UVE 1014 a triarylsulfonium hexafluoroantimonate salt cationic photoinitiator. The polymeric dielectric surface was then roughened, then the piece was baked in air, in a high exhaust rate convection oven at 180° C. for one (1) hour. A sample was removed for surface analysis by x-ray photoelectron spectroscopic analysis. The piece was then immersed in a cationic polyacrylamide polyelectrolyte solution from "Polytec". The substrate was then blanket coated with Pd/Sn seed by immersing the substrate in a seed bath solution containing about 1.5 g/l $PdCl_2$ and about 100 g/l $SnCl_2$. The piece was removed for electron microprobe analysis. The seed coverage was determined to be about 5.0 $\mu g/cm^2$.

To plate copper atop the substrate, the palladium seeded surface was coated with a commercially available photoresist, T168 from Dupont Co. which was then photopatterned to remove the photoresist in areas where circuitization lines were desired, and the workpiece was immersed in an electroless copper plating bath. The photoresist was then stripped.

EXAMPLE 2

A substrate was prepared as in Example 1, except that the substrate was baked at 200° C. rather than 180° C.

EXAMPLE 3

A substrate was prepared as in Example 1, except that the substrate was baked at 160° C. rather than 180° C.

EXAMPLE 4

A substrate was prepared as in Example 1, except that the substrate was baked at 140° C. rather than 180° C.

EXAMPLE 5

A substrate was prepared as in Example 1, except that the substrate was baked at 120° C. rather than 180° C.

EXAMPLE 6

A substrate was prepared as in Example 1, except that the substrate was baked at 100° C. rather than 180° C.

EXAMPLE 7

A substrate was prepared as in Example 1, except that the substrate was baked at 25° C. rather than 180° C.

EXAMPLE 8

A substrate was prepared as in Example 1, except that the substrate wag baked at 200° C. in about 100% oxygen rather than 180° C. in air.

EXAMPLE 9

A substrate was prepared as in Example 1, except that the substrate was baked at 200° C. in 100% nitrogen rather than 180° C. in air.

EXAMPLE 10

A substrate was prepared as in Example 1, except that the substrate was baked for 2 hours rather than 1 hour.

COMPARATIVE EXAMPLE A

A piece was prepared as in Example 1, except the bake stage was omitted. The seed coverage was determined to be 25.4 $\mu g/cm^2$. Repeated runs of comparative examples resulted in seed coverage between about 25.4 $\mu g/cm^2$ and 22 $\mu g/cm^2$.

Analysis of Surface of Baked Polymeric Dielectric Layer of Examples

Figure 3:
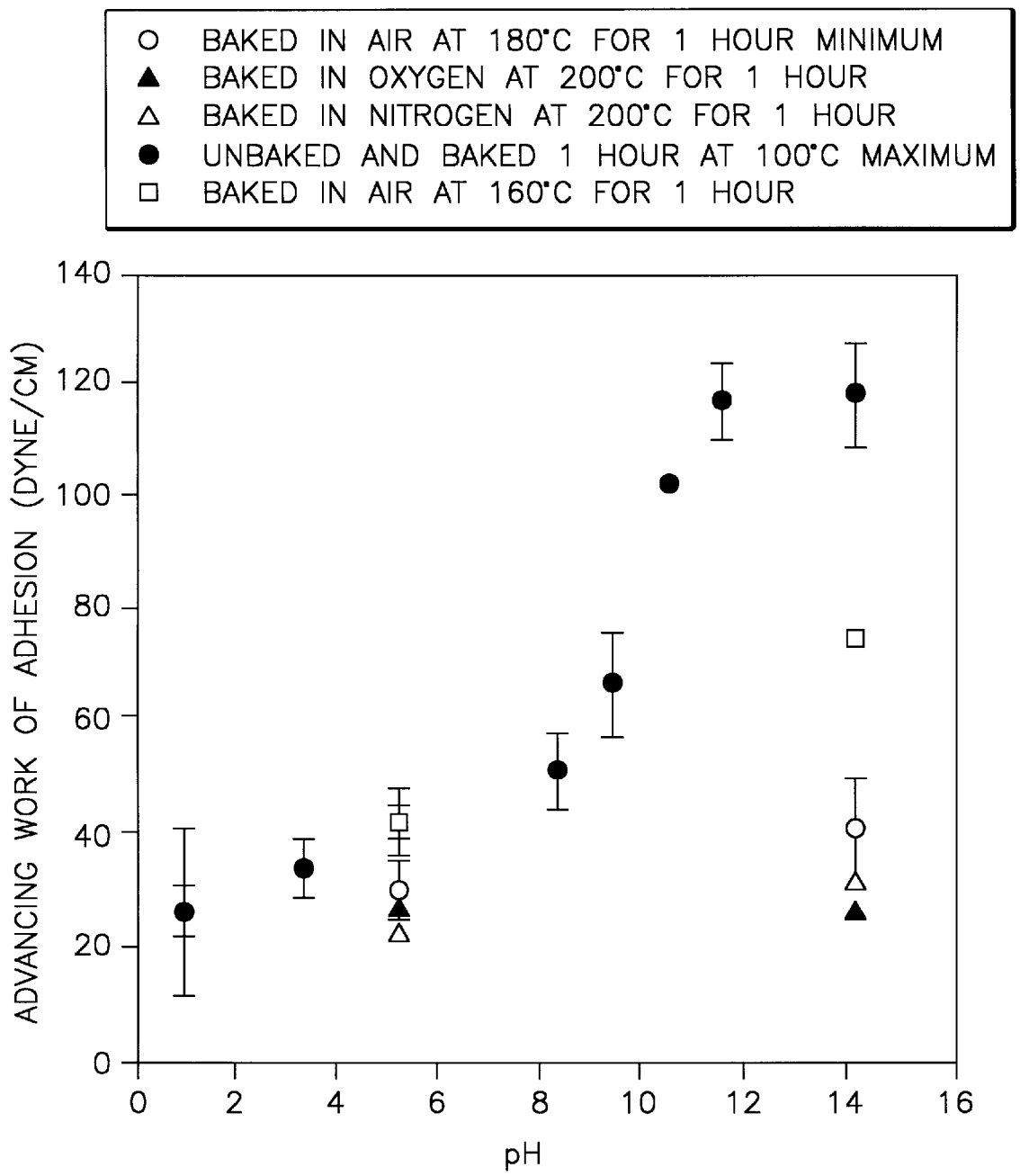
FIG. 3 is a graph of the contact angle titration of baked polymeric dielectric surfaces.

The dynamic wetting force of the dielectric surface of Examples 1–3 and 6–10 after the bake step but prior to seeding, were determined in water and in 1 N solution of sodium hydroxide. Samples were immersed in water, wetting force was measured. The results are shown in FIG. 3.

The surface of the polymeric dielectric of the unbaked Comparative Example displayed a wetting force in water at pH 5.2 of about 42 dyne/cm indicating very hydrophobic surface, yet the wetting force of the Comparative Example in sodium hydroxide indicated that the unbaked dielectric surface was completely wettable. In contrast, the baked surfaces of the polymeric dielectric of Examples 1–3, and 8–10 all showed a decrease in the wetting force in 1 N sodium hydroxide as compared to the Comparative Example.

Since the bake temperature of 180° C. for one to two hours is the lowest temperature which produces a wetting force of the dielectric in 1 N sodium hydroxide about equal to the wetting force in water at pH 5.2, and it this the lowest temperature which produce the least palladium deposition, 180° C. is the preferred temperature for use with the most preferred polymeric dielectric.

Contact Angle Titration

Examples 1–3 and 6–10, and the comparative example were subject to contact angle titration. The results were plotted and are shown as FIG. 3. The advancing work of adhesion for the unbaked comparative example increased with increase in pH. The work of adhesion of the unbaked comparative example increased from about 33.6 dyne/cm at pH of about 3.3, to about 42 dyne/cm at pH 5.2, to about 117.2 dyne/cm at pH 14. In contrast, the baked sample of Example 1 which was baked in air at 180° C. increased from about 26.6 dyne/cm at pH 1, to 29.9 dyne/cm at pH 5.2, to only about 40.4 dyne/cm at pH 14. The sample of Example 8 which was baked in 100% oxygen at 200° C. remained about the same from about 26.7 dyne/cm at pH 5.2, to 26.3 dyne/cm at pH 14; the sample of Example 9 which was baked in nitrogen at 200° C. showed similar results.

X-ray Photoelectron Spectroscopic Analysis

Spectroscopic analysis, was performed with a monochromatized x-ray source, using k alpha x-ray for photo emission, at 15 kev, a power 400 watts, and high resolution spectra for sulfur 2p region were collected. The analysis revealed that about 50 to 100 angstroms depth from the surface, of baked polymeric dielectric layer had reduced number of hydroxyl groups and an increased number of oxidized sulfur moieties. Typically the oxidized sulfur moieties on the surface of the baked polymeric surface were present in excess of about 27%, typically for bakes at 140° C. or greater from 43% to about 76%; the unoxidized sulfur groups were present 24% to 57%. In comparison the unbaked comparative example which had typically had from about 21% to 26% oxidized sulfur groups and from 74% to 79% unoxidized sulfur groups the surface. The oxidation of the sulfur groups was not dependent upon the amount of ambient oxygen; the examples which were baked in nitrogen also displayed the oxidized sulfur groups.

Analysis of Examples after Seeding

The amount of palladium seed present on the work pieces of Examples 1, and 3–7 and Comparative Example A, were determined by electron microprobe analysis, using an electron microprobe available from JOL Corporation, at a setting of 20 K ev, and 60 nanoamps. The beam size employed was 50 micrometers at 50 micrometer intervals stepped at 50 micrometer intervals. PET crystals used for analysis were PET crystals, lines L $\alpha$ for palladium and tin, relative to standard. The polymeric dielectric layer which was not subjected to a heating step prior to being seeded, had palladium seed deposited in the amount of 25.4 $\mu g/cm^2$. The palladium present on example 7, was found to be about 16.4 $\mu g/cm^2$ with a bake of about 25° C. Pieces of Example 6 which were baked at about 100° C. were found to be about 13.5 $\mu g/cm^2$. Pieces of Example 5 which were baked at about 120° C. were found to be about 10 $\mu g/cm^2$. Pieces of Example 4 which were baked at about 140° C. were found to be about 9 $\mu g/cm^2$. Pieces of Example 3 which were baked at about 160° C. were found to be about 8.5 $\mu g/cm^2$. Pieces of Example 1 which were baked at about 180° C. were found to be about 4.5 $\mu g/cm^2$.

Figure 2:
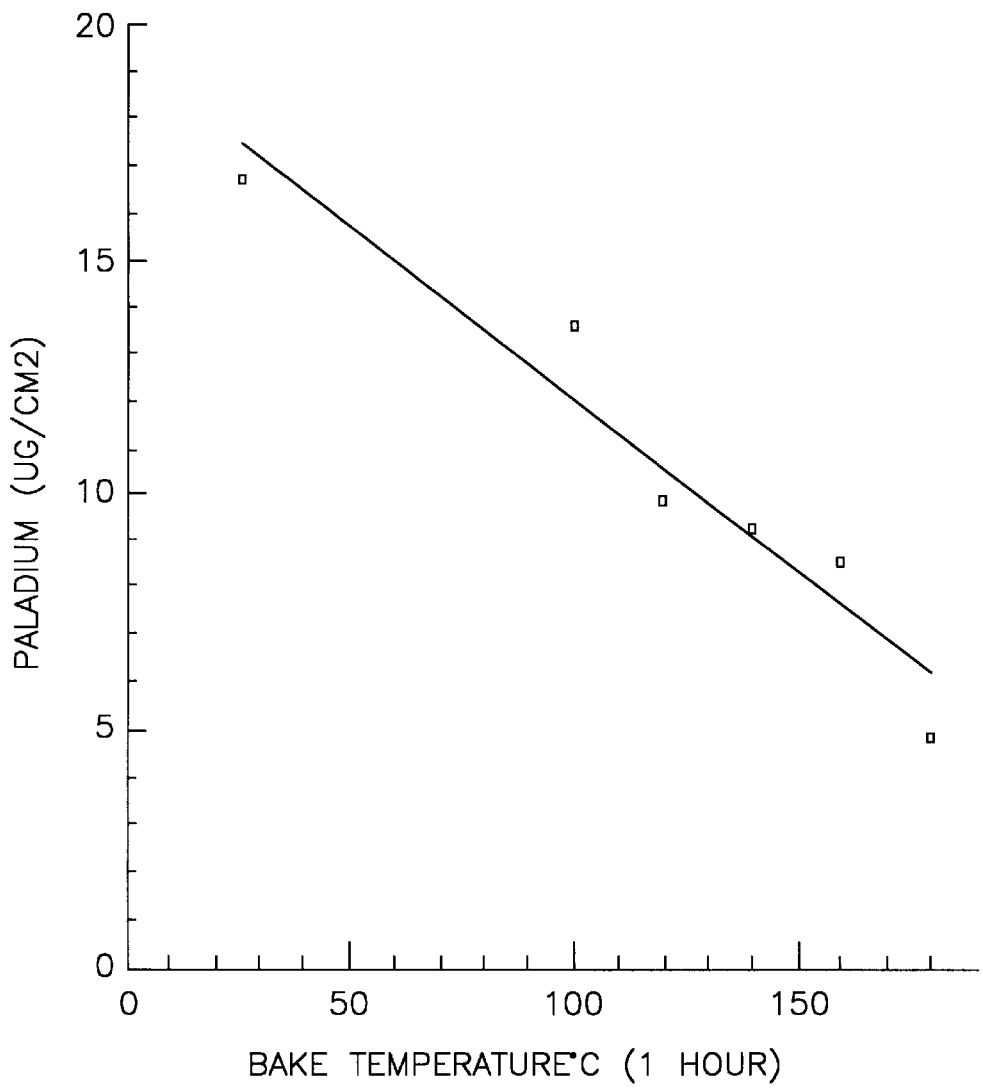
FIG. 2 is a graph showing the seed amount versus bake temperature.

When values for the amount of palladium deposited Example 1 and 3–7 were plotted as a feature of temperature, the graph showed that as the bake temperature was increased, the amount of palladium deposited decreased. This inversely proportional relationship is shown in FIG. 2.

Analysis of Examples after Plating

The line resolution was also determined for Examples 1, 2, and 10; the line width for examples 1 and 2 was 3 mils. The unbaked comparative example was not able to achieve a resolution of 3 mils. The adhesion of the copper lines was also determined by pull test. The adhesion of Example 10 was excellent typically about 4 lbs/inch. In comparison, the unbaked Comparative Example was typically about 3 lbs/inch.

What is claimed is:

1. A method of reducing the amount of seed deposited on a dielectric surface comprising the following steps:
   a) providing a workpiece comprising a substrate coated with a polymeric dielectric layer wherein the polymeric dielectric layer contains hydroxyl groups and scavenger groups on its surface wherein the scavenger groups are selected from sulfur moieties and sulfur atoms;
   b) baking the substrate at a temperature and for a time sufficient to reduce the number of hydroxyl sites available on the surface of the dielectric layer:
   c) applying a polymeric surfactant comprising a cationic polyelectrolyte to the surface of the polymeric dielectric layer, wherein the polymeric surfactant is hydrogen bonded to the remaining hydroxyl groups on the surface of the polymeric dielectric layer;
   d) applying the seed to the polymeric surfactant on the dielectric layer; and
   e) electrolessly plating metal on to the seed deposited in step d.

2. The method of claim 1, wherein the bake temperature is at least about 25° C. and the cationic polyelectrolyte surfactant contains amide groups.

3. The method of claim 1, wherein the seed is deposited in an amount of about 13.5 $\mu g/cm^2$ or less.

4. The method of claim 1, wherein the seed is deposited in an amount of about 11 $\mu g/cm^2$ or less.

5. The method of claim 1, wherein the seed is deposited in an amount of about 9 $\mu g/cm^2$ or less.

6. The method of claim 1, wherein the seed is deposited in an amount 5 to 7 $\mu g/cm^2$.

7. The method of claim 1, wherein the seed is deposited in an amount not less than about 4 $\mu g/cm^2$.

8. The method of claim 1, wherein the seed is deposited in a mono-layer.

9. The method of claim 1 wherein the bake step oxidizes sulfur moieties so that greater than 27% oxidized sulfur moieties are present.

10. The method of claim 1, wherein the polymeric dielectric surface is hydrophobic in NaOH and in $H_2O$.

11. The method of claim 2, wherein the bake temperature is at least about 100° C., the polymeric dielectric layer comprises epoxy resin having hydroxyl groups, and the seed is deposited in an amount of about 13.5 $\mu g/cm^2$ or less.

12. The method of claim 11, wherein the polymeric dielectric includes a complex triarylsulfonium hexafluoroantimonate salt.

13. The method of claim 11, wherein the surface of the polymeric dielectric after baking displays a wetting force in 1 N sodium hydroxide that is from about 35% greater to about 10% less than the wetting force of such surface in water at pH 5.2.

14. The method of claim 11 wherein the surface of the polymeric dielectric after baking displays a wetting force in 1 N NaOH that is within about 25% of the mean of the wetting force value in water at pH 5.2.

15. The method of claim 11, wherein the surfactant has a molecular weight of from about $10^5$ to $10^7$, preferably about $10^6$.

16. The method of claim 15, wherein the surfactant comprises cationic polyamidoamine polyelectrolyte or a cationic polyacrylamide polyelectrolyte.

17. The method of claim 16, wherein the surfactant is cationic polyamido amine polyelectrolyte.

18. The method of claim 2, wherein the polymeric dielectric layer has solids which are comprised of:
   from about 10 to 80%, of phenoxy polyol resin which is the condensation product of epichlorohydrin and bisphenol A, having a molecular weight of from about 40,000 to 130,000;
   from about 20 to 90%, of an epoxidized multifunctional bisphenol A formaldehyde novolac resin having a molecular weight of from about 4,000 to 10,000;
   from 0 to 50%, of a halogenated, preferably brominated, diglycidyl ether of bisphenol A having a molecular weight of from about 600 to 2,500; and
   from about 0.1 to 15 parts, by weight of the total resin weight, of a cationic photoinitiator.

19. The method of claim 16, wherein the polymeric dielectric layer has solids which are comprised of:

from about 20 to 40%, of the phenoxy polyol resin, wherein the phenoxy polyol resin has a weight average molecular weight of about 60,000 to 90,000 and an epoxide value of from about 0.01 to about 0.3 equivalents per kg, a weight per epoxide, of from about 20,000 to about 50,000, and a glass transition temperature of from about 90 to about 110° C.;

from about 25 to 30%, of the epoxidized multifunctional bisphenol A formaldehyde novolac resin having a molecular weight of from about 5,000 to 7,000 and an epoxide value of from about about 3 to about 6, equivalents per kilogram, a weight per epoxide of from about 190 to about 230, and a melting point of from about 70° C. to about 90° C.; and from about 35 to 50%, of a brominated, diglycidyl ether of bisphenol A having a molecular weight of from about 1,000 to 1,700, an epoxide value of from about 1 to about 3 equivalents per kilogram, a weight per epoxide of from about 500 to about 750, and a melting point of from about 80 to about 110° C.

20. The method of claim 18, wherein the polymeric dielectric layer has solids which are comprised of:

about 30%, of the phenoxy polyol resin, wherein the phenoxy polyol resin has an epoxide value of about 0.03 equivalents per kg, a weight per epoxide of about 37,000, and a glass transition temperature of about 98° C.;

from about 25 to 30%, of the epoxidized multifunctional bisphenol A formaldehyde novolac resin has an epoxide value of from about about 4.7 equivalents per kilogram, a weight per epoxide of from about 215, and a melting point of about 82° C.;

from about 35 to 50%, of a brominated, diglycidyl ether of bisphenol A has an epoxide value of about 1.5 equivalents per kilogram, a weight per epoxide of about 675, and a melting point of about 97° C.; and wherein the cationic photoinitiator includes a complex triarylsulfonium hexafluoroantimonate salt.

21. The method of claim 11, further comprising the steps of applying a photoresist to the seeded polymeric dielectric layer, and then photopatterning the photresist, after step d and before step e, wherein in step e the seed areas which are not covered with photoresist are plated.

22. The method of claim 18, further comprising the steps of applying a photoresist to the seeded polymeric dielectric layer, and then photopatterning the photoresist, after step d and before step e wherein in step e the seed areas which are not covered with photoresist are plated.

* * * * *

UNITED STATES PATENT AND TRADEMARK OFFICE
CERTIFICATE OF CORRECTION

PATENT NO. : 5,935,652
DATED : August 10, 1999
INVENTOR(S) : Anastasios Peter Angelopoulos  Gerald Walter Jones  Luis Jesus Matienzo
Thomas Richard Miller  Voya Rista Markovich It is certified that error appears in the above-identified patent and that said Letters Patent is hereby corrected as shown below:

On the Title Page of the Patent, please add the following:

Related U.S. Application Data

Item [62] Division of Ser. No. 08/874,641, June 13, 1997

In the Claims:

Cancel claim 17;

Claim 19, line 11, after "from" cancel "about";

Claim 20, line 21, after "claim" change "18" to --19--;

Claim 22, line17, after "claim" change "18" to --19--;

Signed and Sealed this

Twelfth Day of December, 2000

Attest:

Q. TODD DICKINSON

Attesting Officer        Director of Patents and Trademarks